United States Patent
Taniguchi

(10) Patent No.: US 9,722,575 B2
(45) Date of Patent: Aug. 1, 2017

(54) DUPLEXER

(71) Applicant: TAIYO YUDEN CO., LTD., Tokyo (JP)

(72) Inventor: Noriaki Taniguchi, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 91 days.

(21) Appl. No.: 14/310,956

(22) Filed: Jun. 20, 2014

(65) Prior Publication Data

US 2015/0002241 A1 Jan. 1, 2015

(30) Foreign Application Priority Data

Jun. 27, 2013 (JP) .................................. 2013-135503

(51) Int. Cl.
*H03H 9/70* (2006.01)
*H03H 9/72* (2006.01)
(Continued)

(52) U.S. Cl.
CPC ............ *H03H 9/706* (2013.01); *H03H 9/132* (2013.01); *H03H 9/568* (2013.01); *H03H 9/605* (2013.01); *H03H 9/6483* (2013.01); *H03H 9/725* (2013.01)

(58) Field of Classification Search
CPC ...... H03H 9/568; H03H 9/605; H03H 9/6483; H03H 9/706; H03H 9/725; H03H 9/132
(Continued)

(56) References Cited

U.S. PATENT DOCUMENTS 5,789,845 A * 8/1998 Wadaka ................. H03B 5/326
310/311
5,949,306 A * 9/1999 Hickernell ........... H03H 9/6483
333/193
(Continued)

FOREIGN PATENT DOCUMENTS

| CN | 1494210 A | 5/2004 |
| CN | 1639972 A | 7/2005 |

(Continued)

OTHER PUBLICATIONS

English language machine translation of JP 2011-066933, published on Mar. 31, 2011, 15 pages.*
(Continued)

*Primary Examiner* — Barbara Summons
(74) *Attorney, Agent, or Firm* — Chen Yoshimura LLP

(57) ABSTRACT

A duplexer includes: a transmit filter connected between a transmit terminal and an antenna terminal and including series resonators and parallel resonators connected in a ladder form; and a receive filter connected between a receive terminal and the antenna terminal, wherein at least one of resonators, which are resonators other than a first series resonator and a first parallel resonator located at a first stage as viewed from a side of the transmit terminal and a second series resonator and a second parallel resonator located at a first stage as viewed from a side of the antenna terminal and have electrostatic capacitances less than an electrostatic capacitance of at least one of the first series resonator, the first parallel resonator, the second series resonator, and the second parallel resonator in the series resonators and the parallel resonators, is divided in series.

11 Claims, 11 Drawing Sheets

(51) Int. Cl.
   *H03H 9/54* (2006.01)
   *H03H 9/64* (2006.01)
   *H03H 9/56* (2006.01)
   *H03H 9/13* (2006.01)
   *H03H 9/60* (2006.01)

(58) Field of Classification Search
   USPC .......................................................... 333/133
   See application file for complete search history.

(56) References Cited

U.S. PATENT DOCUMENTS

| | | | | |
|---|---|---|---|---|
| 6,201,457 | B1* | 3/2001 | Hickernell | H03H 9/6409 333/193 |
| 6,972,644 | B2* | 12/2005 | Nishizawa | H03H 9/6483 310/313 D |
| 6,975,185 | B2* | 12/2005 | Tsutsumi | H03H 9/725 333/193 |
| 7,271,684 | B2* | 9/2007 | Nishihara | H03H 9/0095 333/133 |
| 7,830,226 | B2* | 11/2010 | Nam | H03H 9/706 333/133 |
| 2004/0095206 | A1 | 5/2004 | Tsutsumi et al. | |
| 2005/0046520 | A1 | 3/2005 | Nishizawa et al. | |
| 2005/0242903 | A1 | 11/2005 | Inoue et al. | |
| 2007/0030096 | A1 | 2/2007 | Nishihara et al. | |
| 2008/0100397 | A1 | 5/2008 | Nam et al. | |
| 2008/0284540 | A1 | 11/2008 | Nishihara et al. | |
| 2009/0201104 | A1 | 8/2009 | Ueda et al. | |
| 2010/0013573 | A1 | 1/2010 | Umeda | |
| 2012/0126913 | A1* | 5/2012 | Hara | H03H 9/568 333/133 |
| 2014/0197903 | A1* | 7/2014 | Uesaka | H03H 9/706 333/132 |
| 2014/0218128 | A1 | 8/2014 | Fujita | |

FOREIGN PATENT DOCUMENTS

| | | | |
|---|---|---|---|
| CN | 102449907 A | | 5/2012 |
| JP | 2005-318307 A | | 11/2005 |
| JP | 2007-74698 A | | 3/2007 |
| JP | 2008-271230 A | | 11/2008 |
| JP | 2009-207116 A | | 9/2009 |
| JP | 2011-040817 A | | 2/2011 |
| JP | 2011-066933 A | * | 3/2011 |
| WO | 2008/126473 A1 | | 10/2008 |
| WO | WO 2013/046892 A1 | * | 4/2013 |
| WO | 2013/061694 A1 | | 5/2013 |

OTHER PUBLICATIONS

Chinese Office Action dated Aug. 22, 2016, in a counterpart Chinese patent application No. 201410294898.8.

Japanese Office Action dated May 23, 2017, in a counterpart Japanese patent application No. 2013-135503.

* cited by examiner

DUPLEXER

CROSS-REFERENCE TO RELATED APPLICATION

This application is based upon and claims the benefit of priority of the prior Japanese Patent Application No. 2013-135503, filed on Jun. 27, 2013, the entire contents of which are incorporated herein by reference.

FIELD

A certain aspect of the present invention relates to a duplexer.

BACKGROUND

Wireless communication devices typified by mobile phone terminals spread rapidly with the developments in mobile communication systems. For example, in the mobile phone terminals, there has been used high frequency bands such as 800 MHz to 1.0 GHz and 1.5 GHz to 2.0 GHz. Duplexers using a high-frequency filter formed by combining resonators are used in the aforementioned communication devices. As the resonator, used are surface acoustic wave resonators and piezoelectric thin film resonators, for example.

As the wireless communication devices are desired to be reduced in size, there has been developed technology that makes it possible to reduce the size and height of the duplexer as disclosed in Japanese Patent Application Publication No. 2008-271230. In addition, to improve noise characteristics, the use of a balanced-mixer and a balanced low noise amplifier (LNA) has been promoted in a receive circuit, and the use of a balanced-type receive filter has been promoted in the duplexer. From this kind of circumstance, there has been developed technology to improve balance characteristics of the balanced-type filter as disclosed in Japanese Patent Application Publication No. 2005-318307.

In addition, as a high-frequency filter used in the duplexer, there has been ladder-type filters in which a series resonator and a parallel resonator are connected in a ladder form. There has been developed technology that makes it possible to improve characteristics of the ladder-type filter and reduce the size of the ladder-type filter as disclosed in Japanese Patent Application Publication Nos. 2009-207116 and 2007-74698.

When the ladder-type filter is used for a transmit filter connected between an antenna terminal and a transmit terminal, unnecessary waves increase and second harmonic characteristics degrade.

SUMMARY OF THE INVENTION

According to an aspect of the present invention, there is provided a duplexer including: a transmit filter connected between a transmit terminal and an antenna terminal and including series resonators and parallel resonators connected in a ladder form; and a receive filter connected between a receive terminal and the antenna terminal, wherein at least one of resonators, which are resonators other than a first series resonator and a first parallel resonator located at a first stage as viewed from a side of the transmit terminal and a second series resonator and a second parallel resonator located at a first stage as viewed from a side of the antenna terminal and have electrostatic capacitances less than an electrostatic capacitance of at least one of the first series resonator, the first parallel resonator, the second series resonator, and the second parallel resonator in the series resonators and the parallel resonators, is divided in series.

DETAILED DESCRIPTION

Hereinafter, a description will be given of embodiments of the present invention with reference to the attached drawings.

First Embodiment

Figure 1:
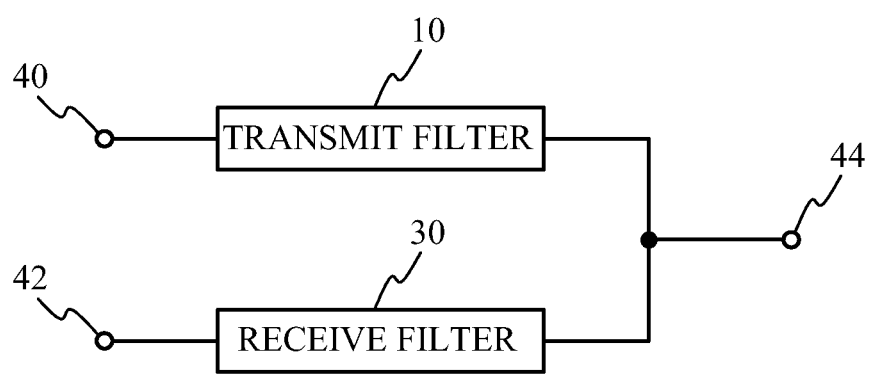
FIG. 1 is a block diagram illustrating a duplexer in accordance with a first embodiment.

FIG. 1 is a block diagram illustrating a duplexer in accordance with a first embodiment. As illustrated in FIG. 1, a transmit filter 10 is connected between a transmit terminal 40 and an antenna terminal 44. A receive filter 30 is connected between a receive terminal 42 and the antenna terminal 44. The transmit filter 10 and the receive filter 30 have different passbands. The transmit filter 10 passes signals in the transmit band, out of signals input from the transmit terminal 40, to the antenna terminal 44 as transmission signals, and suppresses signals in other bands. The receive filter 30 passes signals in the receive band, out of signals input from the antenna terminal 44, to the receive terminal 42 as reception signals, and suppresses signals in other bands. The transmit filter 10 is a ladder-type filter including series resonators and parallel resonators. The receive filter 30 may be a ladder-type filter, a multimode type filter, a filter formed by combining a ladder-type filter and a multimode type filter, or other filters.

Figure 2:
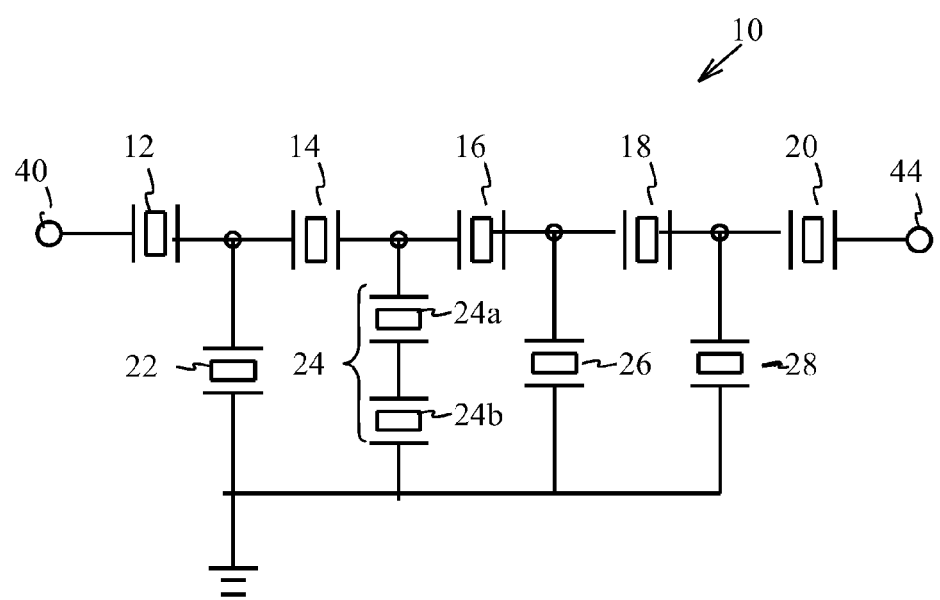
FIG. 2 is a circuit diagram illustrating a transmit filter of the duplexer of the first embodiment.

FIG. 2 is a circuit diagram illustrating the transmit filter of the duplexer of the first embodiment. As illustrated in FIG. 2, the transmit filter 10 includes series resonators 12~20 connected in series and parallel resonators 22~28 connected in parallel between the transmit terminal 40 and the antenna terminal 44. The parallel resonator 24 is divided in series and composed of a divided resonator 24a and a divided resonator 24b. When the electrostatic capacitance of the parallel resonator 24 is C and the electrostatic capacitances of the divided resonators 24a and 24b are $C_1$ and $C_2$ respectively, $C_1=C_2=2C$. The parallel resonator 24 has an electrostatic capacitance less than the electrostatic capacitance of at least one of the series resonator 12 and the parallel resonator 22 located at the first stage as viewed from the transmit terminal 40 side and the series resonator 20 and the parallel resonator 28 located at the first stage as viewed from the antenna terminal 44 side. That is to say, the total of the electrostatic capacitances of the divided resonators 24a and 24b is less than the electrostatic capacitance of at least one of the series resonator 12 and the parallel resonator 22 located at the first stage as viewed from the transmit terminal 40 side and the series resonator 20 and the parallel resonator 28 located at the first stage as viewed from the antenna terminal 44 side. Hereinafter, the series resonator and the parallel resonator located at the first stage as viewed from the transmit terminal 40 side are referred to as transmit-side resonators, and the series resonator and the parallel resonator located at the first stage as viewed from the antenna terminal 44 side are referred to as antenna-side resonators.

Figure 3A:
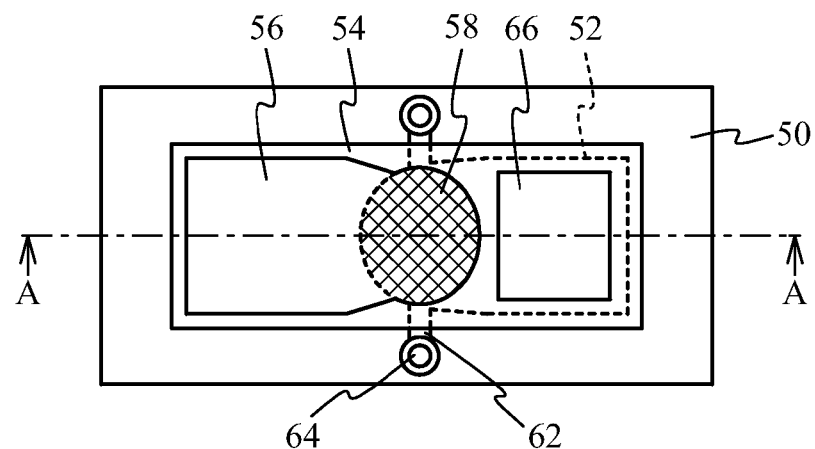
FIG. 3A is a top view illustrating a piezoelectric thin film resonator.
Figure 3B:
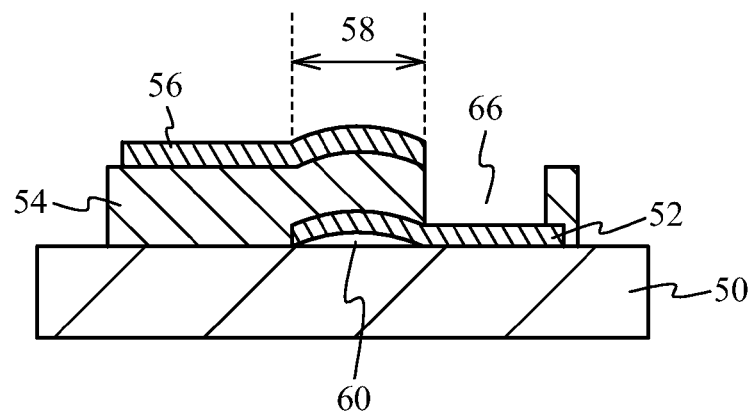
FIG. 3B is a cross-sectional view taken along line A-A in FIG. 3A.

Here, a description will be given of the series resonator and the parallel resonator. The series resonator and the parallel resonator are piezoelectric thin film resonators having, for example, an FBAR (Film Bulk Acoustic Resonator) structure. FIG. 3A is a top view illustrating a piezoelectric thin film resonator, and FIG. 3B is a cross-sectional view taken along line A-A in FIG. 3A. As illustrated in FIG. 3A and FIG. 3B, a lower electrode 52 containing, for example, ruthenium (Ru) is located on a substrate 50 such as a silicon (Si) substrate so that an air-space 60 having a dome-shaped bulge is formed between the lower electrode 52 and the upper surface of the substrate 50. The dome-shaped bulge is a bulge having a shape in which the height of the air-space 60 is low in the periphery of the air-space 60 and the height of the air-space 60 increases at closer distances to the center of the air-space 60. A piezoelectric film 54 made of, for example, aluminum nitride (AlN) is located on the lower electrode 52 and the substrate 50. An upper electrode 56 containing, for example, Ru is located on the piezoelectric film 54 so as to have a region facing the lower electrode 52 (a resonance region 58). The resonance region 58 has, for example, an elliptical shape, and is a region in which an acoustic wave in a thickness extension mode resonates.

An introduction path 62 for etching a sacrifice layer is formed in the lower electrode 52. The sacrifice layer is a layer for forming the air-space 60. The piezoelectric film 54 does not cover the vicinity of the tip of the introduction path 62, and the lower electrode 52 includes a hole portion 64 at the tip of the introduction path 62. An aperture 66 for providing an electrical connection to the lower electrode 52 is formed in the piezoelectric film 54. A recessed portion may be formed in the substrate 50 as the air-space 60 instead of forming the dome-shaped air-space 60 between the upper surface of the substrate 50 and the lower electrode 52. The recessed portion may or may not penetrate through the substrate 50.

The magnitude of the electrostatic capacitance depends on the size of the region (the resonance region 58) in which the lower electrode 52 and the upper electrode 56 face each other across the piezoelectric film 54. Accordingly, when the aforementioned divided resonators 24a, 24b have electrostatic capacitances twice the electrostatic capacitance of the parallel resonator 24, that means $S_1=S_2=2S$ where S represents the area of the resonance region 58 of the non-divided parallel resonator 24 and $S_1$ and $S_2$ respectively represent the areas of the resonance regions 58 of the divided resonators 24a, 24b. The resonant frequency of the non-divided parallel resonator 24 is equal to the resonant frequencies of the divided resonators 24a, 24b, and $Fr=Fr_1=Fr_2$ where Fr, $Fr_1$, and $Fr_2$ respectively represent the resonant frequencies of the non-divided parallel resonator 24 and the divided resonators 24a, 24b.

A description will now be given of a simulation performed by the inventor. The inventor performed the simulation to a duplexer using a ladder-type filter, of which the number of stages is less than that of the ladder-type filter illustrated in FIG. 2 by one, as a transmit filter. That is to say, the ladder-type filter not including the series resonator 20 and the parallel resonator 28 in FIG. 2 is used for the transmit filter. The simulation was performed under the assumption that the series resonators 12~18 of the transmit filter 10 have electrostatic capacitances of 1.7 pF, 0.96 pF, 0.96 pF, and 1.42 pF respectively and the parallel resonators 22~26 have electrostatic capacitances of 1.67 pF, 0.67 pF, and 1.96 pF respectively. That is to say, the divided resonators 24a, 24b formed by dividing the parallel resonator 24 in series have electrostatic capacitances of 1.34 pF. In addition, each resonator is a piezoelectric thin film resonator having an FBAR structure and aluminum nitride is used for a piezoelectric film. The magnitude of the second harmonic output from the antenna terminal 44 was calculated when signals with amplitudes of 29 dBm and frequencies of 2.5~2.57 GHz are input to the transmit filter 10 from the transmit terminal 40. For comparison, the simulation was also performed under the same condition to a first comparative example having the same structure as the first embodiment except that the parallel resonator 24 is not divided.

Figure 4:
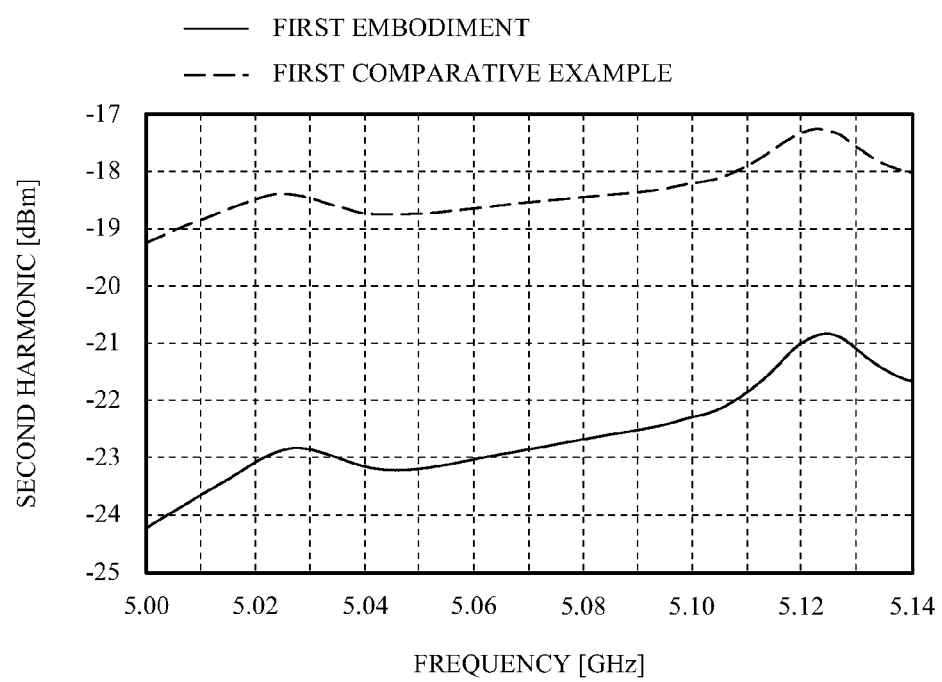
FIG. 4 is a diagram illustrating simulation results.

FIG. 4 is a diagram illustrating simulation results. In FIG. 4, the horizontal axis represents a frequency, and the vertical axis represents a magnitude of the second harmonic. In FIG. 4, the solid line indicates the simulation result of the first embodiment, and the dashed line indicates the simulation result of the first comparative example. As illustrated in FIG. 4, the first embodiment obtains better second harmonic characteristics than the first comparative example. The reason why the second harmonic characteristics are improved by dividing the parallel resonator 24 in series is considered as follows.

The impedances of the transmit terminal 40 and the antenna terminal 44 are designed to be, for example, 50Ω. Thus, to prevent the impedance mismatch, the impedance of the transmit filter 10 is matched with the impedances of the transmit terminal 40 and the antenna terminal 44. The impedance of the transmit filter 10 is adjusted by using the transmit-side resonators and the antenna-side resonators. This makes the electrostatic capacitances of the transmit-side resonators and the antenna-side resonators greater than those of other resonators. In other words, the electrostatic capacitances of the resonators other than the transmit-side resonators and the antenna-side resonators are relatively low.

This means that the areas of the resonance regions 58 of the resonators are relatively small. As high-power signals are input to the transmit filter 10, the electrical power per unit area of the resonance region 58 is large in these resonators. Accordingly, unnecessary waves due to non-linear strain are generated, and the second harmonic characteristics degrade. As described above, the resonators having relatively low electrostatic capacitances except the transmit-side resonators and the antenna-side resonators generate unnecessary waves, and the second harmonic characteristics degrade.

The first embodiment divides the parallel resonator 24, which is a resonator other than the transmit-side resonators and the antenna-side resonators and has an electrostatic capacitance less than the electrostatic capacitance of at least one of the transmit-side resonators and the antenna-side resonators, in series to form the divided resonators 24a, 24b. This allows the divided resonators 24a, 24b to have electrostatic capacitances greater than the electrostatic capacitance of the parallel resonator 24, and thereby increases the area of the resonance region 58. Accordingly, in the first embodiment, the electrical power per unit area of the resonance region 58 can be reduced in the parallel resonator 24 with a low electrostatic capacitance, and thus the generation of unnecessary waves due to non-linear strain is suppressed, and good second harmonic characteristics are obtained.

The first embodiment divides the parallel resonator 24, which is a resonator other than the transmit-side resonators and the antenna-side resonators and has an electrostatic capacitance less than the electrostatic capacitance of at least one of the transmit-side resonators and the antenna-side resonators in the series resonators and the parallel resonators, in series as illustrated in FIG. 2. This suppresses the generation of unnecessary waves due to non-linear strain and makes it possible to obtain good second harmonic characteristics as described in FIG. 4.

As described above, the resonators other than the transmit-side resonators and the antenna-side resonators in the series resonators and the parallel resonators tend to have electrostatic capacitances less than those of the transmit-side resonators and the antenna-side resonators. Therefore, there is a case where resonators out of the resonators other than the transmit-side resonators and the antenna-side resonators have electrostatic capacitances less than the electrostatic capacitance of at least one of the transmit-side resonators and the antenna-side resonators. In the aforementioned case, it is sufficient if at least one of the resonators, which are resonators other than the transmit-side resonators and the antenna-side resonators and have electrostatic capacitances less than the electrostatic capacitance of at least one of the transmit-side resonators and the antenna-side resonators, is divided in series. Additionally, to further improve the second harmonic characteristics, all the resonators having electrostatic capacitances less than the electrostatic capacitance of at least one of the transmit-side resonators and the antenna-side resonators may be divided in series.

The transmit-side resonators and the antenna-side resonators may be divided in series. However, as the second harmonic characteristics are degraded by a resonator having a low electrostatic capacitance, the transmit-side resonators and the antenna-side resonators having relatively high electrostatic capacitances are preferably not divided in series. This is because the division of these resonators is not very effective in improving the second harmonic characteristics, but increases the size of the device.

To improve the second harmonic characteristics, the resonator having a low electrostatic capacitance is preferably divided in series. Therefore, it is preferable that at least one of the resonators, which are resonators other than the transmit-side resonators and the antenna-side resonators and have electrostatic capacitances less than the electrostatic capacitances of the transmit-side resonators and the antenna-side resonators in the series resonators and the parallel resonators, is divided in series, and more preferable that all of them are divided in series. Additionally, at least the resonator having the lowest electrostatic capacitance among the resonators other than the transmit-side resonators and the antenna-side resonators is preferably divided in series.

When there is a resonator having an electrostatic capacitance less than one-half of the electrostatic capacitances of the transmit-side resonators and the antenna-side resonators in the resonators other than the transmit-side resonators and the antenna-side resonators, unnecessary waves remarkably increase. Therefore, it is preferable that the resonator having an electrostatic capacitance less than one-half of the electrostatic capacitances of the transmit-side resonators and the antenna-side resonators is divided in series. Additionally, to reduce the size of the device, it is preferable that the resonator having an electrostatic capacitance less than one-third of the electrostatic capacitances of the transmit-side resonators and the antenna-side resonators is divided in series.

Figure 5A:
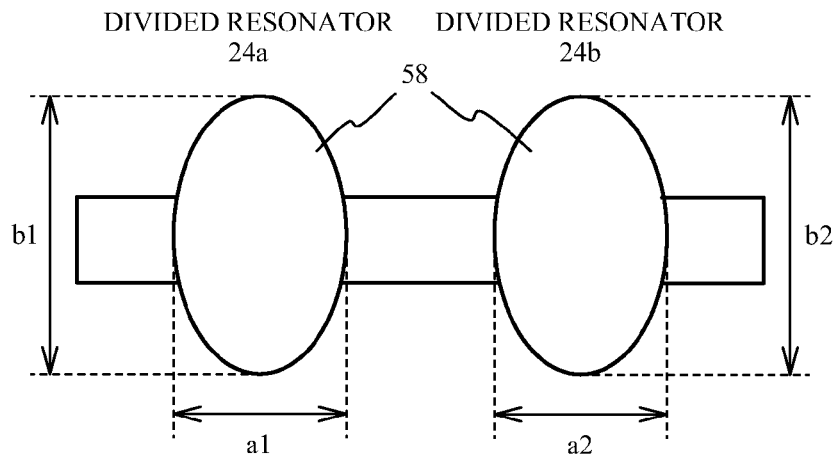
FIG. 5A through FIG. 5C are top views illustrating resonance regions.
Figure 5B:
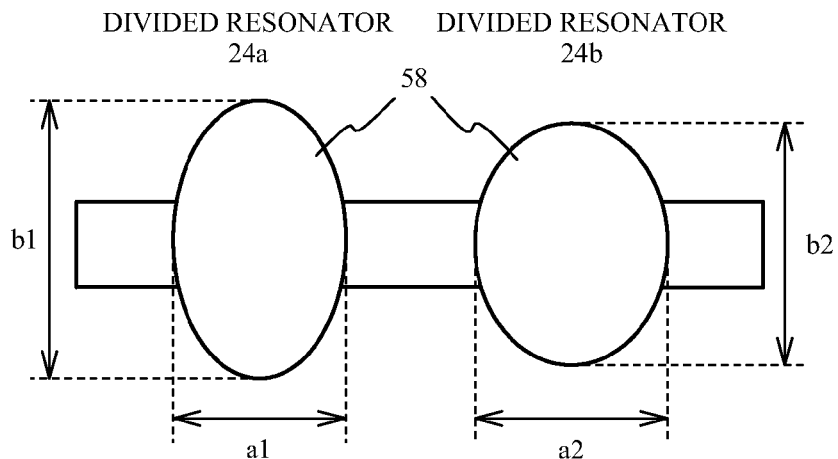
Figure 5C:
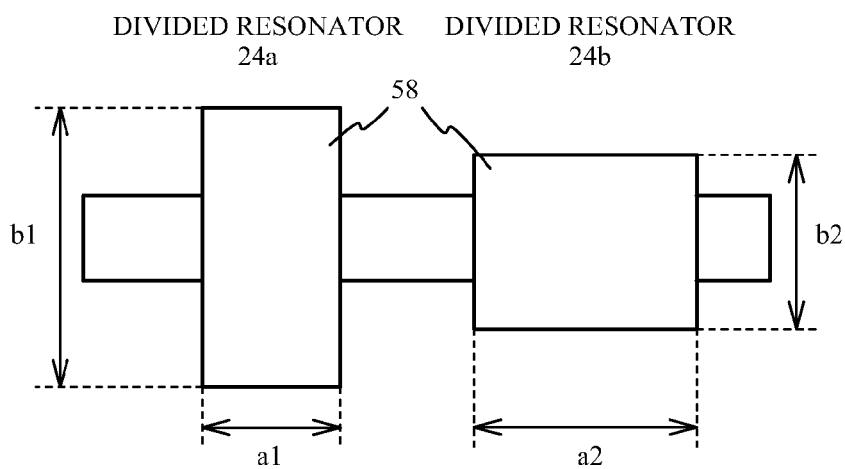

In the first embodiment, the resonance region 58 has an elliptical shape as illustrated in FIG. 3A, but may have other shapes such as a rectangular shape. In addition, the shapes of the resonance regions 58 of the divided resonators 24a, 24b may be the same, but preferably differ from each other. The reason thereof will be described with reference to the drawings. FIG. 5A through FIG. 5C are top views illustrating the resonance regions 58. As illustrated in FIG. 5A, the resonance regions 58 of the divided resonators 24a, 24b may have the same area (the same electrostatic capacitance) and the same shape. That is to say, $a_1$ may be equal to $a_2$ ($a_1=a_2$) and $b_1$ may be equal to $b_2$ ($b_1=b_2$) where $a_1$ represents the length of the minor axis of the resonance region 58 of the divided resonator 24a, $b_1$ represents the length of the major axis, $a_2$ represents the length of the minor axis of the resonance region 58 of the divided resonator 24b, and $b_2$ represents the length of the major axis.

However, as illustrated in FIG. 5B, the resonance regions 58 of the divided resonators 24a, 24b preferably have the same area (the same electrostatic capacitance) and different shapes. That is to say, it is preferable that $a_1$ is not equal to $a_2$, $b_1$ is not equal to $b_2$, and $a_1 \times b_1$ is equal to $a_2 \times b_2$. In addition, also in a case where the resonance regions 58 have a rectangular shape, they preferably have the same area (the same electrostatic capacitance) and different shapes as illustrated in FIG. 5C. That is to say, it is preferable that $a_1$ is not equal to $a_2$, $b_1$ is not equal to $b_2$, and $a_1 \times b_1$ is equal to $a_2 \times b_2$ where $a_1$ represents the length of the horizontal side of the resonance region 58 of the divided resonator 24a, $b_1$ represents the length of the vertical side, $a_2$ represents the length of the horizontal side of the resonance region 58 of the divided resonator 24b, and $b_2$ represents the length of the vertical side. The generation frequencies of spurious in the divided resonators can be made to differ from each other by making the shapes of the resonance regions 58 of the divided resonators 24a, 24b different from each other. This makes it possible to disperse spurious and to reduce the effect on the pass characteristics of the filter.

Figure 6:
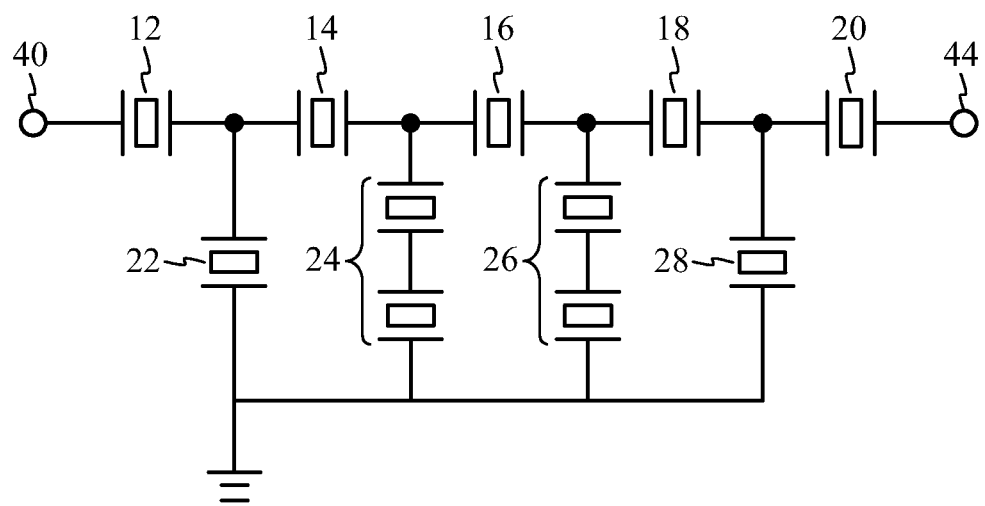
FIG. 6 is a circuit diagram illustrating a transmit filter of a duplexer in accordance with a first variation of the first embodiment.

FIG. 6 is a circuit diagram illustrating a transmit filter of a duplexer in accordance with a first variation of the first embodiment. In the first variation of the first embodiment, at least all the parallel resonators 24~26 out of the resonators other than the transmit-side resonators and the antenna-side resonators have electrostatic capacitances less than the electrostatic capacitance of at least one of the transmit-side resonators and the antenna-side resonators. In this case, as illustrated in FIG. 6, all the parallel resonators 24~26, which are the parallel resonators other than the parallel resonator 22 located at the first stage as viewed from the transmit terminal 40 side and the parallel resonator 28 located at the first stage as viewed from the antenna terminal 44 side, may be divided in series.

Second Embodiment

Figure 7:
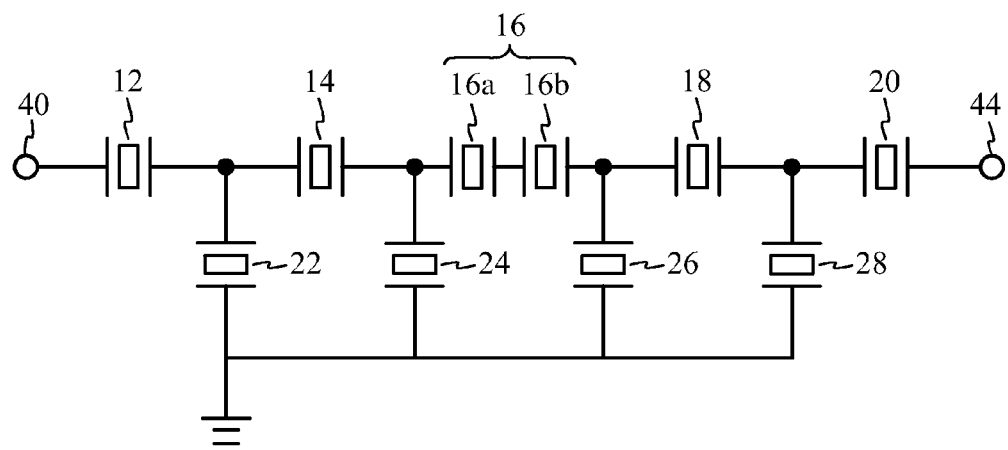
FIG. 7 is a circuit diagram illustrating a transmit filter of a duplexer in accordance with a second embodiment.

A second embodiment divides the series resonator in series. FIG. 7 is a circuit diagram illustrating a transmit filter of a duplexer in accordance with the second embodiment. As illustrated in FIG. 7, in the second embodiment, the series resonator 16 is divided in series in the series resonators 12~20 connected in series and the parallel resonators 22~28 connected in parallel between the transmit terminal 40 and the antenna terminal 44. The series resonator 16 is composed of divided resonators 16a, 16b. The series resonator 16 have an electrostatic capacitance less than the electrostatic capacitance of at least one of the transmit-side resonators and the antenna-side resonators. That is to say, the total of the electrostatic capacitances of the divided resonators 16a, 16b is less than the electrostatic capacitance of at least one of the transmit-side resonators and the antenna-side resonators.

In the first embodiment, the parallel resonator 24 is divided in series. Alternatively, as described in the second embodiment, the series resonator 16, which is a resonator other than the transmit-side resonators and the antenna-side resonators and has an electrostatic capacitance less than the electrostatic capacitance of at least one of the transmit-side resonators and the antenna-side resonators, may be divided in series.

Figure 8:
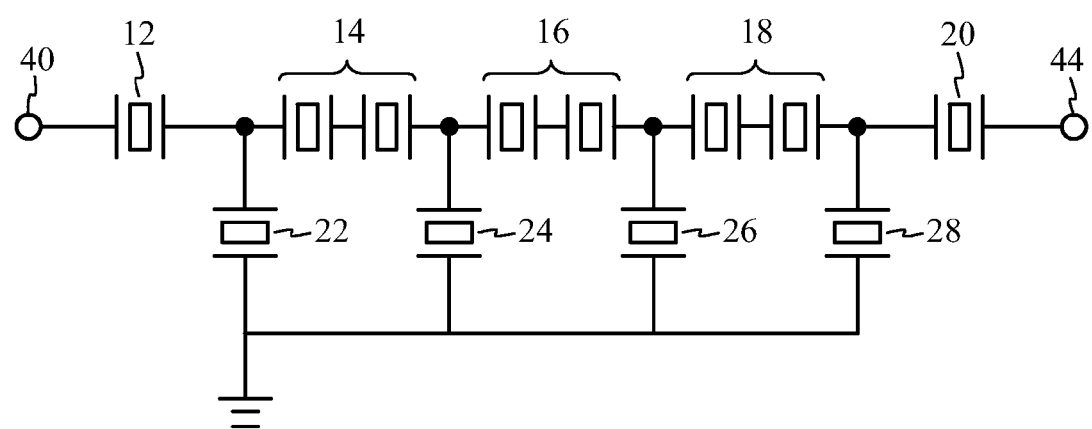
FIG. 8 is a circuit diagram illustrating a transmit filter of a duplexer in accordance with a first variation of the second embodiment.

FIG. 8 is a circuit diagram illustrating a transmit filter of a duplexer in accordance with a first variation of the second embodiment. In the first variation of the second embodiment, at least all the series resonators 14~18 out of the resonators other than the transmit-side resonators and the antenna-side resonators have electrostatic capacitances less than the electrostatic capacitance of at least one of the transmit-side resonators and the antenna-side resonators. In this case, as illustrated in FIG. 8, all the series resonators 14~18, which are the series resonators other than the series resonator 12 located at the first stage as viewed from the transmit terminal 40 side and the series resonator 20 located at the first stage as viewed from the antenna terminal 44 side, may be divided in series.

Third Embodiment

Figure 9:
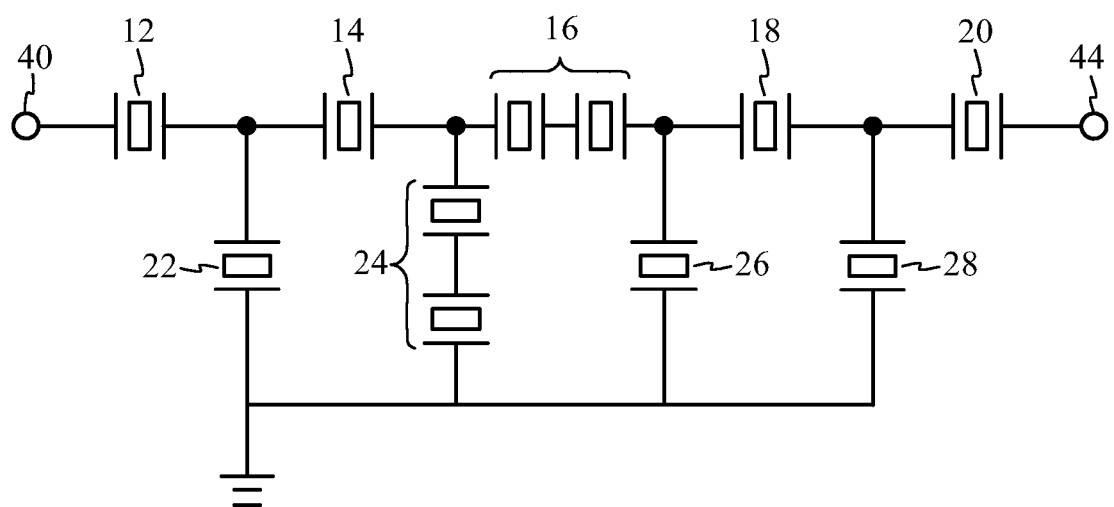
FIG. 9 is a circuit diagram illustrating a transmit filter of a duplexer in accordance with a third embodiment.

A third embodiment divides the parallel resonator and the series resonator in series. FIG. 9 is a circuit diagram illustrating a transmit filter of a duplexer in accordance with the third embodiment. As illustrated in FIG. 9, in the third embodiment, divided in series are the series resonator 16 and the parallel resonator 24 out of the series resonators 12~20 connected in series and the parallel resonators 22~28 connected in parallel between the transmit terminal 40 and the antenna terminal 44.

In the first embodiment, the parallel resonator 24 is divided in series, and in the second embodiment, the series resonator 16 is divided in series. Alternatively, as described in the third embodiment, the series resonator 16 and the parallel resonator 24 may be divided in series.

Figure 10A:
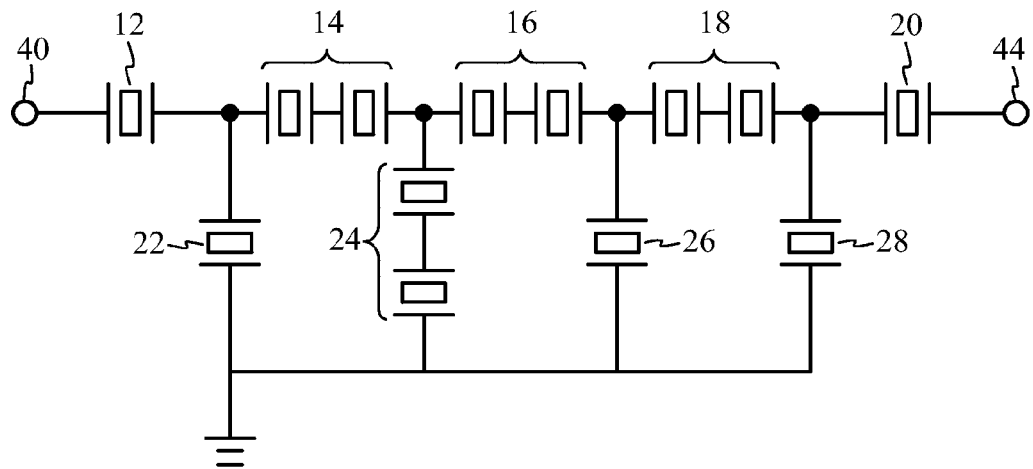
FIG. 10A through FIG. 10C are circuit diagrams illustrating transmit filters of duplexers in accordance with first through third variations of the third embodiment.
Figure 10B:
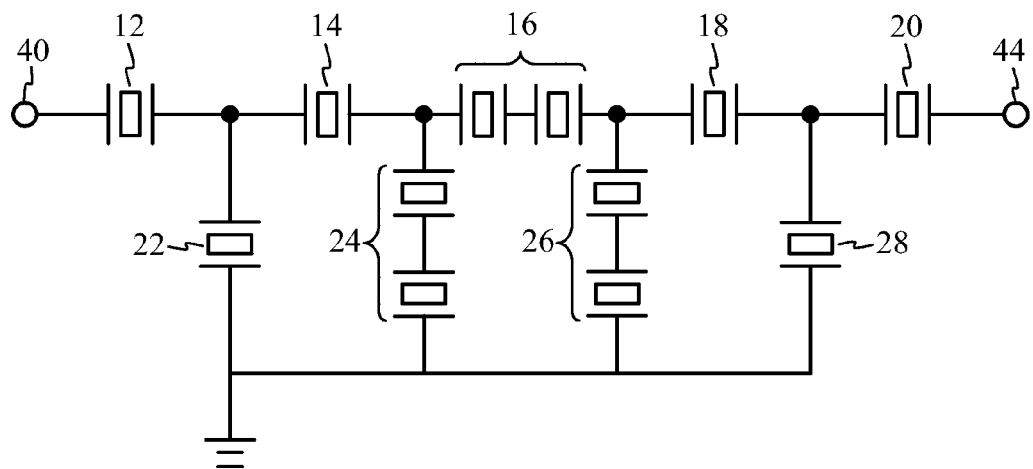
Figure 10C:
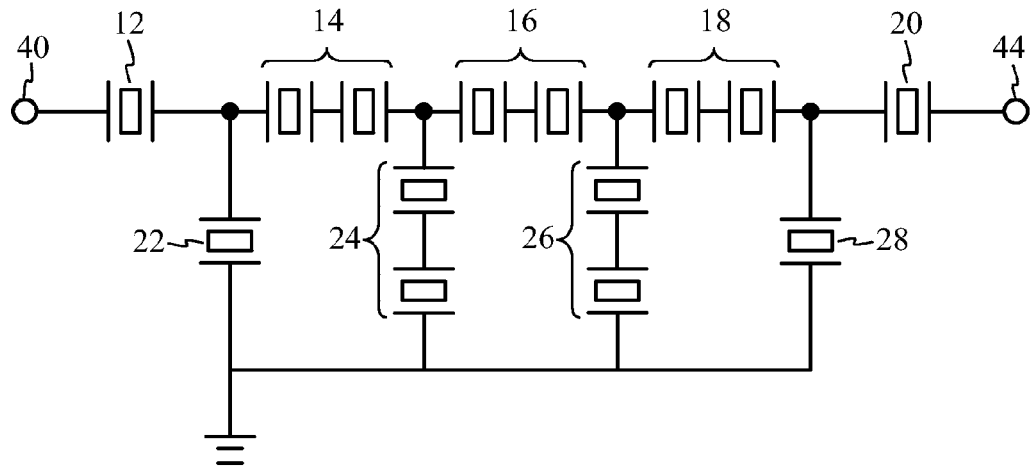

FIG. 10A through FIG. 10C are circuit diagrams illustrating transmit filters of duplexers in accordance with first through third variations of the third embodiment. In the first variation of the third embodiment, at least all the series resonators 14~18 and the parallel resonator 24 out of the resonators other than the transmit-side resonators and the antenna-side resonators have electrostatic capacitances less than the electrostatic capacitance of at least one of the transmit-side resonators and the antenna-side resonators. In this case, as illustrated in FIG. 10A, all the series resonators 14~18 and the parallel resonator 24 may be divided in series.

In the second variation of the third embodiment, at least the series resonator 16 and all the parallel resonators 24~26 out of the resonators other than the transmit-side resonators and the antenna-side resonators have electrostatic capacitances less than the electrostatic capacitance of at least one of the transmit-side resonators and the antenna-side resonators. In this case, as illustrated in FIG. 10B, the series resonator 16 and all the parallel resonators 24~26 may be divided in series.

In the third variation of the third embodiment, all the series resonators 16~18 and all the parallel resonators 24~26 out of the resonators other than the transmit-side resonators and the antenna-side resonators have electrostatic capacitances less than the electrostatic capacitance of at least one of the transmit-side resonators and the antenna-side resonators. In this case, as illustrated in FIG. 10C, all the series resonators 16~18 and all the parallel resonators 24~26 may be divided in series.

As described in the third embodiment and the first through third variations thereof, at least one of the series resonators other than the series resonators located at the first stages as viewed from the transmit terminal 40 side and the antenna terminal 44 side and at least one of the parallel resonators other than the parallel resonators located at the first stages as viewed from the transmit terminal 40 side and the antenna terminal 44 side may be divided in series.

As illustrated in FIG. 3A and FIG. 3B, a piezoelectric thin film resonator having an FBAR structure is described as the series resonator and the parallel resonator of the transmit filter, but a piezoelectric thin film resonator having an SMR (Solid Mounted Resonator) structure including an acoustic reflection film instead of the air-space 60 may be used as the series resonator and the parallel resonator.

Figure 11A:
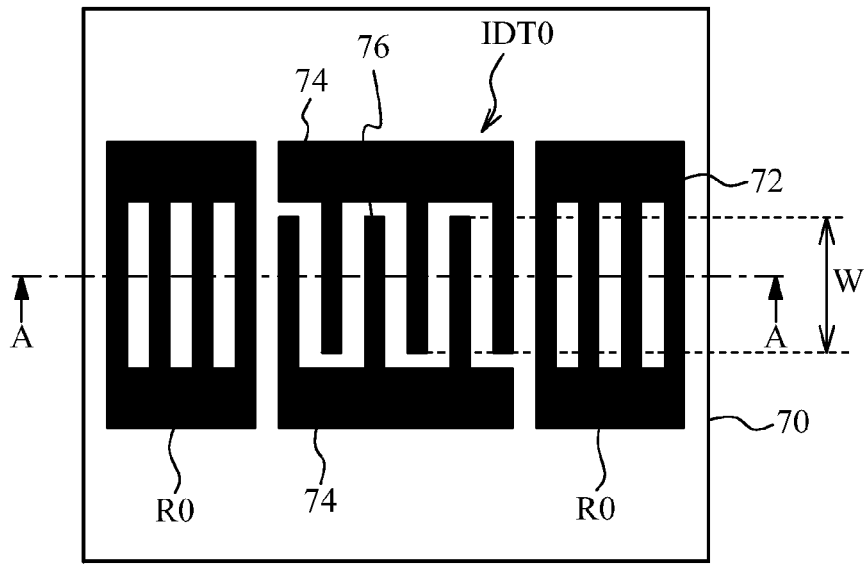
FIG. 11A is a top view illustrating a surface acoustic wave resonator.
Figure 11B:
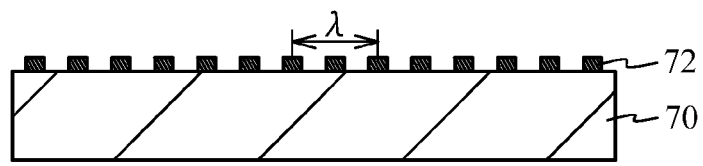
FIG. 11B is a cross-sectional view taken along line A-A in FIG. 11A.
Figure 11C:
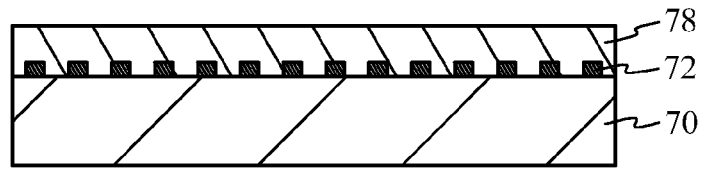
FIG. 11C is a cross-sectional view illustrating a Love wave resonator.
Figure 11D:
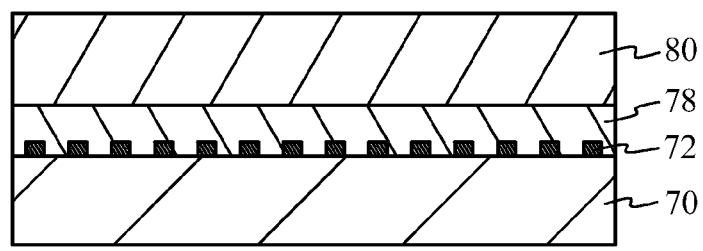
FIG. 11D is a cross-sectional view illustrating a boundary acoustic wave resonator.

Additionally, the series resonator and the parallel resonator may be a surface acoustic wave resonator, a Love wave resonator, or a boundary acoustic wave resonator. FIG. 11A is a top view illustrating a surface acoustic wave resonator, and FIG. 11B is a cross-sectional view taken along line A-A in FIG. 11A. FIG. 11C is a cross-sectional view of a Love wave resonator, and FIG. 11D is a cross-sectional view of a boundary acoustic wave resonator. As illustrated in FIG. 11A and FIG. 11B, a metal film 72 made of aluminum or copper is located on a piezoelectric substrate 70 made of a piezoelectric substance such as lithium tantalate or lithium niobate. The metal film 72 forms reflectors R0 and an IDT (Interdigital Transducer) IDT0. The IDT includes two comb-shaped electrodes 74. The reflectors R0 are located at both sides of the IDT0 in the propagation direction of the acoustic wave. The comb-shaped electrodes 74 and the reflectors R0 include electrode fingers 76 arranged at intervals corresponding to the wavelength λ of the acoustic wave. A width along which the electrode fingers 76 of the two comb-shaped electrodes 74 overlap with each other is an aperture length W. The surface acoustic wave excited by the IDT0 is reflected by the reflectors R0.

This resonates the surface acoustic wave resonator at a frequency corresponding to the wavelength λ of the acoustic wave.

The top views of the Love wave resonator and the boundary acoustic wave resonator are the same as FIG. 11A, and thus a description thereof is omitted. As illustrated in FIG. 11C, in the Love wave resonator, a dielectric film 78 is located so as to cover the metal film 72. The dielectric film 78 may be made of, for example, silicon oxide. As illustrated in FIG. 11D, in the boundary acoustic wave resonator, the dielectric film 80 is further located on the dielectric film 78. The dielectric film 80 may be made of, for example, aluminum oxide. To confine the acoustic wave in the dielectric film 78, the dielectric film 80 has an acoustic velocity greater than that of the dielectric film 78.

In the piezoelectric thin film resonator, the magnitude of the electrostatic capacitance depends on the size of the resonance region where the lower electrode and the upper electrode face each other across the piezoelectric film. In the surface acoustic wave resonator, the Love wave resonator, and the boundary acoustic wave resonator, it depends on (the number of pairs of the electrode fingers 76)×(the aperture length W) when the intervals between the electrode fingers 76 are constant.

Although the embodiments of the present invention have been described in detail, it is to be understood that the various change, substitutions, and alterations could be made hereto without departing from the spirit and scope of the invention.

What is claimed is:

1. A duplexer comprising:
a transmit filter connected between a transmit terminal and an antenna terminal and including series resonators and parallel resonators connected in a ladder form; and
a receive filter connected between a receive terminal and the antenna terminal, wherein
at least one of resonators, which are resonators other than a first series resonator and a first parallel resonator located at a first stage as viewed from a side of the transmit terminal and a second series resonator and a second parallel resonator located at a first stage as viewed from a side of the antenna terminal and have electrostatic capacitances less than an electrostatic capacitance of at least one of the first series resonator, the first parallel resonator, the second series resonator, and the second parallel resonator in the series resonators and the parallel resonators, is divided in series, and
the at least one of resonators includes at least one of the series resonators other than the first series resonator and the second series resonator and at least one of the parallel resonators other than the first parallel resonator and the second parallel resonator.

2. The duplexer according to claim 1, wherein
the at least one of resonators is composed of divided resonators, and
the divided resonators are piezoelectric thin film resonators.

3. The duplexer according to claim 2, wherein
resonance regions, in which an upper electrode and a lower electrode face each other across a piezoelectric film, of the divided resonators have different shapes.

4. The duplexer according to claim 1, wherein
the first series resonator, the first parallel resonator, the second series resonator, and the second parallel resonator are not divided in series.

5. The duplexer according to claim 1, wherein
the at least one of resonators includes a resonator having an electrostatic capacitance less than the electrostatic capacitances of the first series resonator, the first parallel resonator, the second series resonator, and the second parallel resonator.

6. The duplexer according to claim 1, wherein
the at least one of resonators includes a resonator having a lower electrostatic capacitance among the resonators other than the first series resonator, the first parallel resonator, the second series resonator, and the second parallel resonator.

7. A duplexer comprising:
a transmit filter connected between a transmit terminal and an antenna terminal and including series resonators and parallel resonators connected in a ladder form; and
a receive filter connected between a receive terminal and the antenna terminal, wherein
at least one of resonators, which are resonators other than a first series resonator and a first parallel resonator located at a first stage as viewed from a side of the transmit terminal and a second series resonator and a second parallel resonator located at a first stage as viewed from a side of the antenna terminal and have electrostatic capacitances less than an electrostatic capacitance of at least one of the first series resonator, the first parallel resonator, the second series resonator, and the second parallel resonator in the series resonators and the parallel resonators, is divided in series, and
one of the following (a) through (b) is met:
(a) the at least one of resonators includes all the series resonators other than the first series resonator and the second series resonator, and the first series resonator and the second series resonator are not divided in series,
(b) the at least one of resonators includes all the parallel resonators other than the first parallel resonator and the second parallel resonator, and the first parallel resonator and the second parallel resonator are not divided in series.

8. The duplexer according to claim 7, wherein
the at least one of resonators is composed of divided resonators, and
the divided resonators are piezoelectric thin film resonators.

9. The duplexer according to claim 8, wherein
resonance regions, in which an upper electrode and a lower electrode face each other across a piezoelectric film, of the divided resonators have different shapes.

10. The duplexer according to claim 7, wherein
the at least one of resonators includes a resonator having an electrostatic capacitance less than the electrostatic capacitances of the first series resonator, the first parallel resonator, the second series resonator, and the second parallel resonator.

11. The duplexer according to claim 7, wherein
the at least one of resonators includes a resonator having a lower electrostatic capacitance among the resonators other than the first series resonator, the first parallel resonator, the second series resonator, and the second parallel resonator.

* * * * *